(12) United States Patent
Yang et al.

(10) Patent No.: US 7,569,864 B2
(45) Date of Patent: Aug. 4, 2009

(54) SILICON-RICH-OXIDE WHITE LIGHT PHOTODIODE

(75) Inventors: Tsun-Neng Yang, Taipei (TW); Shan-Ming Lan, Dasi Township Taoyuan County (TW); Wei-Yang Ma, Banciao (TW)

(73) Assignee: Atomic Energy Council-Institute of Nuclear Energy Research, Taoyuan (TW)

( * ) Notice: Subject to any disclaimer, the term of this patent is extended or adjusted under 35 U.S.C. 154(b) by 64 days.

(21) Appl. No.: 11/416,146

(22) Filed: May 3, 2006

(65) Prior Publication Data

US 2007/0257285 A1    Nov. 8, 2007

(51) Int. Cl.
*H01L 31/12* (2006.01)
*H01L 31/00* (2006.01)

(52) U.S. Cl. .............................. 257/98; 257/13; 257/80
(58) Field of Classification Search ................. 257/291, 257/292, 13, 79, 80, 98, 184
See application file for complete search history.

(56) References Cited

U.S. PATENT DOCUMENTS

| 5,629,517 | A | * | 5/1997 | Jackson et al. | ........... 250/208.1 |
| 6,617,189 | B1 | * | 9/2003 | Chen et al. | ..................... 438/48 |
| 7,358,101 | B2 | * | 4/2008 | Yang et al. | ..................... 438/21 |
| 7,391,046 | B2 | * | 6/2008 | Tsutsumi et al. | ............... 257/13 |

* cited by examiner

*Primary Examiner*—Anh Phung
*Assistant Examiner*—Allison P Bernstein

(57) ABSTRACT

A white light photodiode has a film layer and an ultraviolet (UV) photodiode. The film layer is made of an oxide rich in silicon; and is formed through a chemical vapor deposition. A white light can be generated by exciting the film layer with a UV light from the UV photodiode.

14 Claims, 5 Drawing Sheets

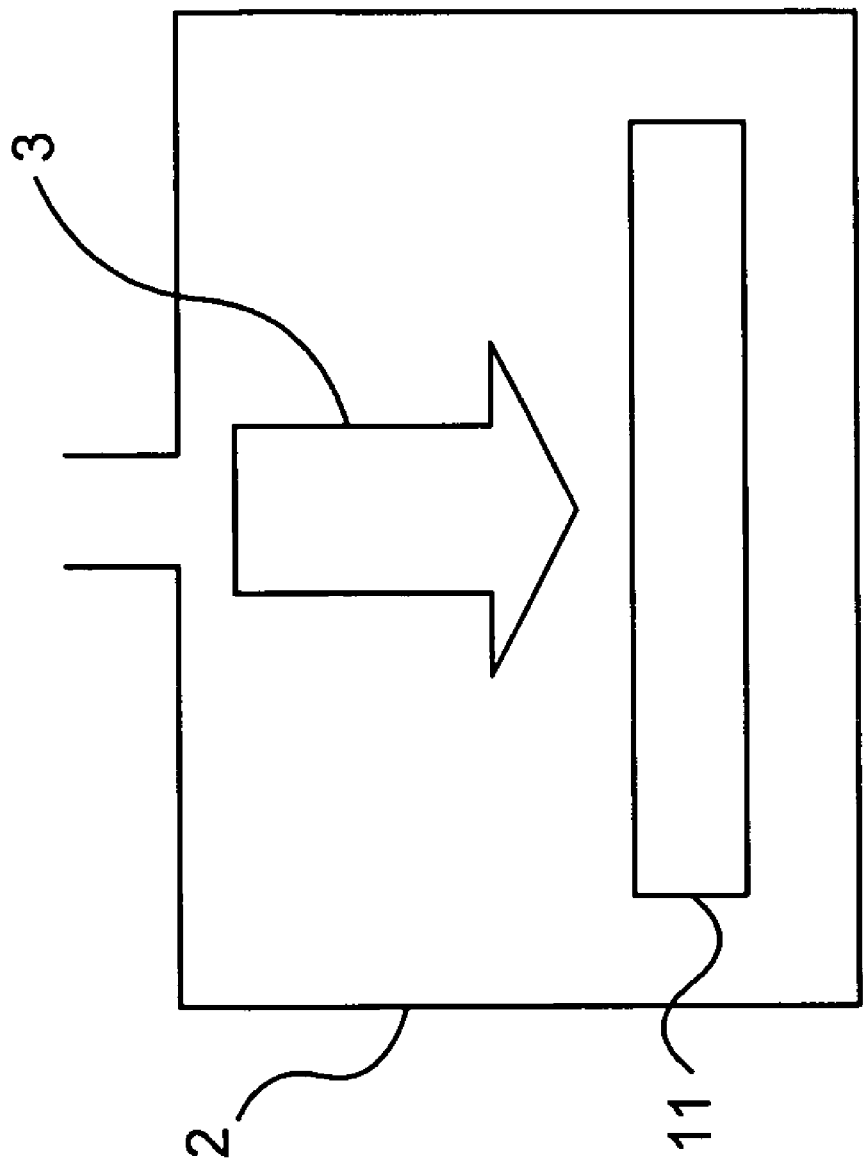

SILICON-RICH-OXIDE WHITE LIGHT PHOTODIODE

FIELD OF THE INVENTION

The present invention relates to a white light photodiode; more particularly, relates to exciting a silicon-rich-oxide (SRO) film layer to obtain a white light with an ultraviolet (UV) light generated from a UV photodiode, where the silicon (Si) nano-grains evenly distributed in the SRO film layer are the main facto for generating the white light; and are obtained through a PECVD (Plasma-Enhanced Chemical Vapor Deposition) procedure along with helium or argon as a gas for dilution and transition.

DESCRIPTION OF THE RELATED ARTS

Since year 2000, a visual light photodiode is developed toward a brighter and more efficient one; and it has been 36 years since Monsanto, H P, etc. promote their productions of GaAsP (Gallium Arsenide Phosphide)/GaAs (Gallium Arsenide) red-light photodiodes. After the oil crisis In 1937, Japan has put much emphasis on developing GaP (Gallium Phosphide) red-light photodiodes for its low power consumption and long lifetime.

In 1947, the first transistor is invented. Ever since, Si material has played a major role in the semiconductor field. According to a prediction of the Moore's Law, about every 18 months, the size requirement for a certain semiconductor would shrink to a half of its original size. Moore's Law is true when there's new technologies come in and new applications are developed, where Si material is exactly one of the base for this rapid progress.

Today, quite a mass data transference relies on photon, which results in urgent needs toward all kinds of broadband photoelectronic components. Currently, the photoelectronic components are basically made of materials having direct energy gap, which are column III-V elements. Hence Si material is still limited in its applications on detectors, arrayed CCD (charge-coupled device) image sensors and solar cells. After years of effort, the applications of Si material on related semiconductor fields are the most integrated and the cheapest. Once a Si material is developed to obtain a light emitting device, the characteristics on integration and low cost are at once its strong points. In addition, there would lies a possibility on integrating the light emitting device with a Large Scale Integration integrated circuit (LSI IC).

The Si material is an inefficient light source under room temperature owing to its indirect energy gap. Its light-radiation coincidence is low and its inner quantum emitting efficiency is only about $10^{-6} \sim 10^{-7}$, so that the Si material is deprived from being made into a light emitting device.

In 1990, L. T. Can ham found that, by using an anodic electrolytic Si material in a hydrofluoric (HF) acid solution, a porous Si material is formed with a capability of generating a visible light source efficiently. Afterward, research teams all over the world start to join in this worldwide competition on developing a novel Si light source. In the field on developing the Si light source, the effort is previously focus on obtaining the porous Si material; yet now a Si nano-grain formed in a Si oxide with high stability is a hit. Nevertheless, in spite of the notable progress in developing Si-based photodiodes, no merchandized product of Si-based photodiode appears.

A nano-grain obtains special photo-electronic characteristics other than materials of normal size, where, according to a quantum confinement effect, the energy gap of a material becomes wider when its size gets smaller. However, a light-emitting device made of porous Si has some major defects, such as the followings: (i) Owing to its porous structure like sponge, it is fragile. (ii) Chemically, it is highly active to react with the oxygen in air so that, after a period of use, its photoelectronic characteristics would fade so greatly to an extent hard to be recovered. At the present time, the main raw material for fabricating the Si photodiode is Si dioxide ($SiO_2$), where Si nano-grains are formed to obtain a stable $SiO_2$/Si interface with an improved emitting effect. In a word, the composition and structure of the $SiO_2$/Si interface determines how a luminance center is formed and determines the characteristics of the light spectrum obtained.

A few methods have been introduced in obtaining the Si nano-grain. One of a widely used method among them is to form a sub-stoichiometric $SiO_2$ film at first; then to apply an annealing process to the film for a phase separation of two different metal phases in the film, where Si and $SiO_2$ are the two different metal phases; and then to obtain Si nano-grains having an arranged structure and a $SiO_2$ having a homogenized structure. Because the $SiO_2$ has a homogenized structure, a problem of a straining between the Si nano-grains and the $SiO_2$ does not happen. The size and the density of the Si nano-grains is controlled by parameters for the film deposition and the annealing.

Chemical vapor deposition (CVD) is widely used in fabricating semiconductors. According to the requirements on working temperature range (a variation between 100° C. and 1000° C.) and working pressure range (a variation between 1 atmospheric pressure and 7 pascal or 0.05 torr), there are three types of CVDs: an Atmospheric Pressure Chemical Vapor Deposition (APCVD), a Low Pressure Chemical Vapor Deposition (LPCVD), and a Plasma-Enhanced Chemical Vapor Deposition (PECVD). The CVDs have advantages in that (1) the composition and the structure of the film deposited can be precisely controlled; (2) the deposition is even; (3) the depositing speed is fast; (4) the production amount is high; and (5) the cost is low. Another method widely used in fabricating semiconductors is Ion-Beam Assisted Deposition (IBAD), applied in fabricating LSI ICs. The IBAD is a mature technology for years, where speeded Si ions are directly implanted into a $SiO_2$ film material to locally form excessive Si atoms in the film; and then an annealing is processed to obtain Si nano-grains in the film. The IBAD has the following characteristics: (1) By adjusting the energy and the dose of the ion implanted, required excessive Si atom density and distribution are obtained in a specific area and a specific depth range. And, (2) during the ion implantation, a few structural defects appears, which lowers the diffusion activity of the atoms such that the temperature of annealing for metal phase separation is lowered as well. As a result, implanting excessive Si atoms to a certain density, like several to tens percents of atoms, takes time; and so IBAD is not fit for mass production.

Regardless of for the CVDs or the IBAD, those research teams use low temperature procedures. For example, they may use PECVD under a temperature between 300° C. and 500° C. with $SiH_4$(Silane) and $O_2$(oxygen) as chemical reaction sources and $H_2$(hydrogen) as a gas for dilution and transition to form a sub-stoichiometric Si oxide film with high hydrogen atoms, where x in SiOx:H is smaller than 2. The excited luminance spectrum of the Si oxide film obtained totally lies in 600 nm (nanometer) to 1000 nm, or in an even longer wavelength range. By going through the annealing process with an increasing in annealing temperature and annealing time, the brightness is first increased then decreased; and the luminance spectrum is getting wider and is shifting toward the infrared light zone. Such a phenomenon is due to that the size of the Si nano-grains is getting bigger and the density is getting lower, which exactly follows the quantum confinement effect. Yet, with all the efforts on the Si-rich oxide by those research teams, the obtained luminance spectrum still lies between red light zone and infrared light zone. It is still not possible to obtain a white light from a Si-rich oxide.

Although the above prior arts all obtain photodiodes of Si-rich oxide, its luminance spectrum lies only between red light zone and infrared light zone. Hence, the prior arts do not fulfill users' requests on actual use.

SUMMARY OF THE INVENTION

The main purpose of the present invention is to obtain a white light photodiode, where an SRO film layer is excited to obtain a white light with a UV light generated from a UV photodiode.

To achieve the above purpose, the present invention is an SRO white light photodiode, comprising a first substrate, an SRO film layer and a UV photodiode having a second substrate, where Si nano-grains evenly distributed in the SRO film layer are obtained through a PECVD procedure along with helium or argon as a gas for dilution and transition; a white light luminance center is obtained by Si nano-grains in the SRO film layer; and the granular sizes of the Si nano-grains are the main factor for obtaining a white light spectrum. Accordingly, a novel SRO white light photodiode is obtained.

BRIEF DESCRIPTIONS OF THE DRAWINGS

The present invention will be better understood from the following detailed description of the preferred embodiment according to the present invention, taken in con junction with the accompanying drawings, in which FIG. 1 is a structural view showing the first preferred embodiment according to the present invention;

FIG. 3A is a view showing the first substrate being heated to a deposition temperature;

DESCRIPTION OF THE PREFERRED EMBODIMENT

The following description of the preferred embodiment is provided to understand the features and the structures of the present invention.

Figure 1:
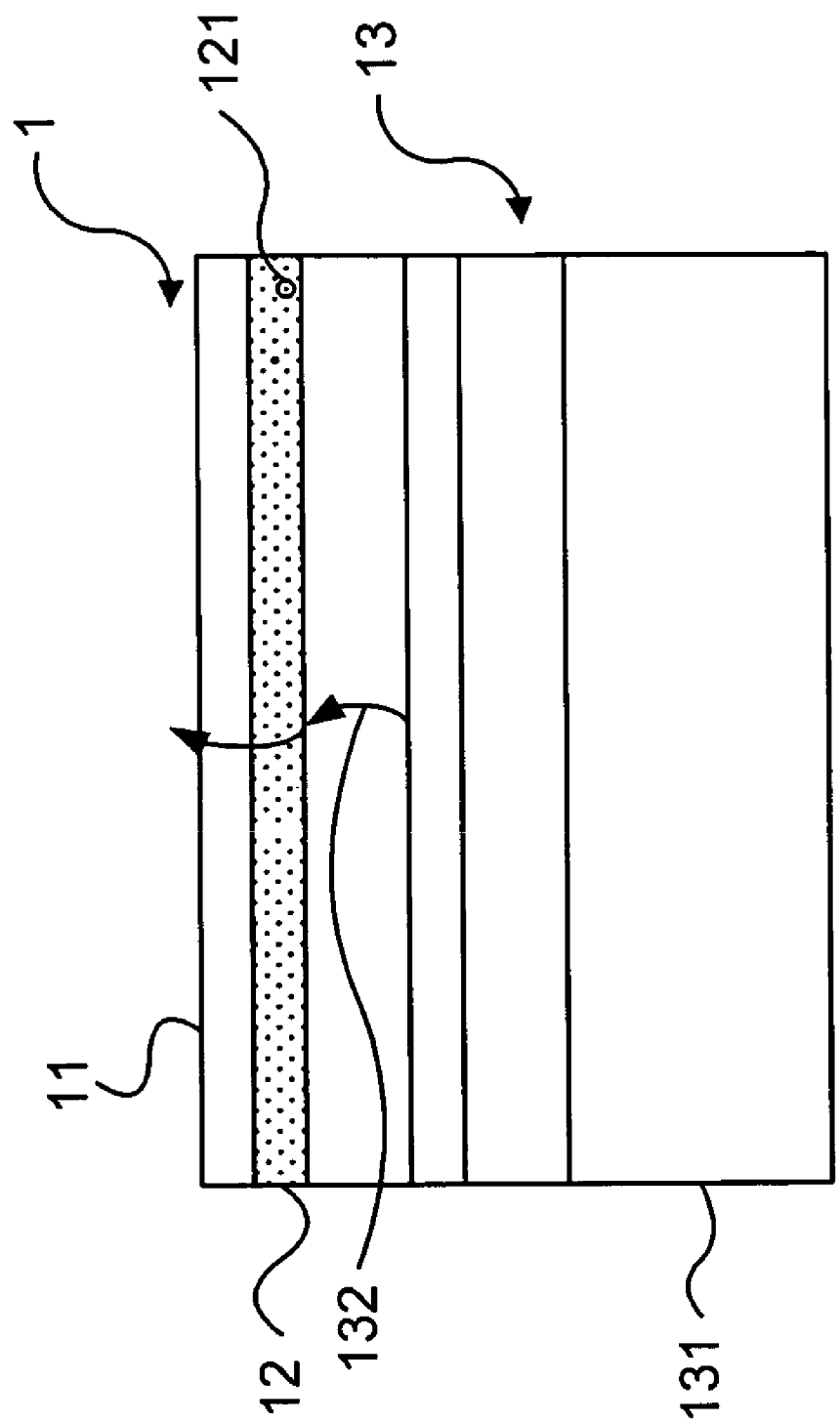

Please refer to FIG. 1, which is a structural view showing the first preferred embodiment according to the present invention. As shown in the figure, the present invention is a silicon-rich-oxide (SRO) white light photodiode 1, comprising a first substrate 11, an SRO film layer 12 and an ultraviolet (UV) photodiode 13.

The first substrate 11 is made of a quartz, an aluminum oxide ($Al_2O_3$) or a glass; and so the first substrate 11 is a transparent substrate.

The SRO film layer 12 has a thickness between 1 nanometer (nm) and 10000 nm and is evenly distributed with silicon (Si) nano-grains 121 inside, where the granular size of the Si nano-grain 121 is between 0.1 nm and 10 nm; a white light luminance center is obtained by Si nano-grains 121 in the SRO film layer 12; and the granular sizes of the Si nano-grains 121 are the main factor for obtaining a white light spectrum.

The UV photodiode 13 has a second substrate 131, where the second substrate 131 is made of a quartz, a $Al_2O_3$ or a glass; and so the second substrate 131 is a transparent substrate.

In the first preferred embodiment, the SRO film layer 12 is adhered to a surface of the UV photodiode 13 by using an adhesive at the back of the second substrate 131 of the UV photodiode 13, where the UV light 132 generated by the UV photodiode 13 excites the SRO film layer 12 to obtain a continuous light spectrum having a wavelength between 400 nm and 700 nm, a wavelength duration for a white light.

Figure 2:
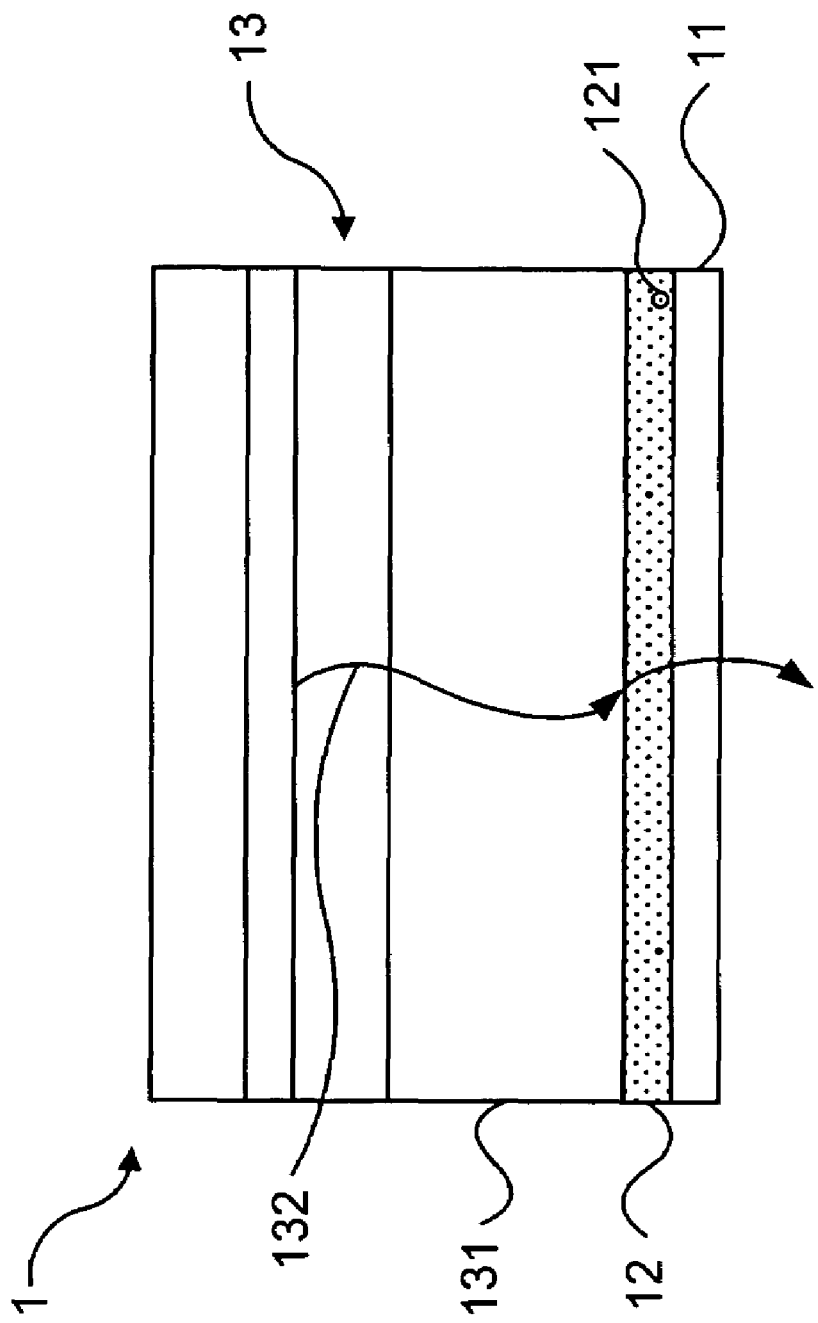
FIG. 2 is a structural view showing the second preferred embodiment.

Please refer to FIG. 2, which is a structural view showing the second preferred embodiment. As shown in the figure, the SRO film layer 12 of the second preferred embodiment is adhered to a second substrate 131 of a UV photodiode by using an adhesive to obtain a structure of a flip chip, where the UV light 132 generated by the UV photodiode 13 excites the SRO film layer 12 to obtain a continuous light spectrum having a wavelength between 400 nm and 700 nm, a wavelength duration for a white light.

Figure 3B:
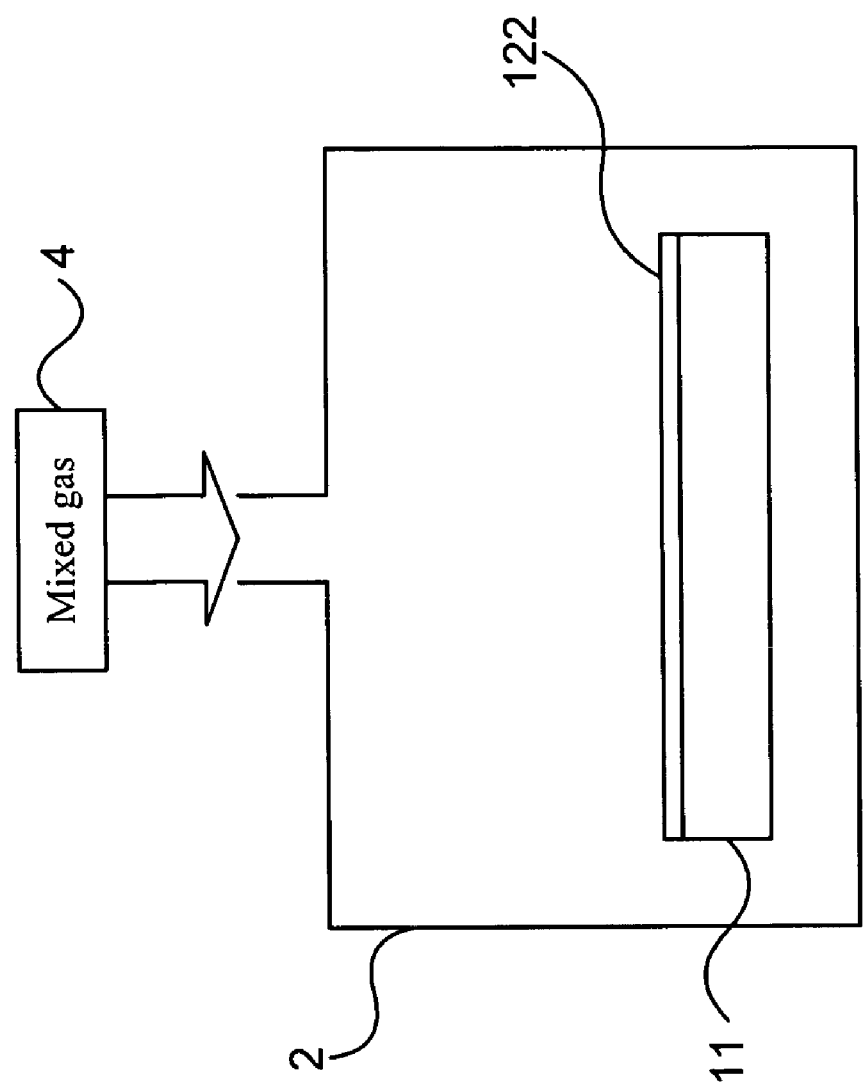
FIG. 3B is a view showing the sub-stoichiometric Si oxide film being deposited on a surface of the first substrate.
Figure 3C:
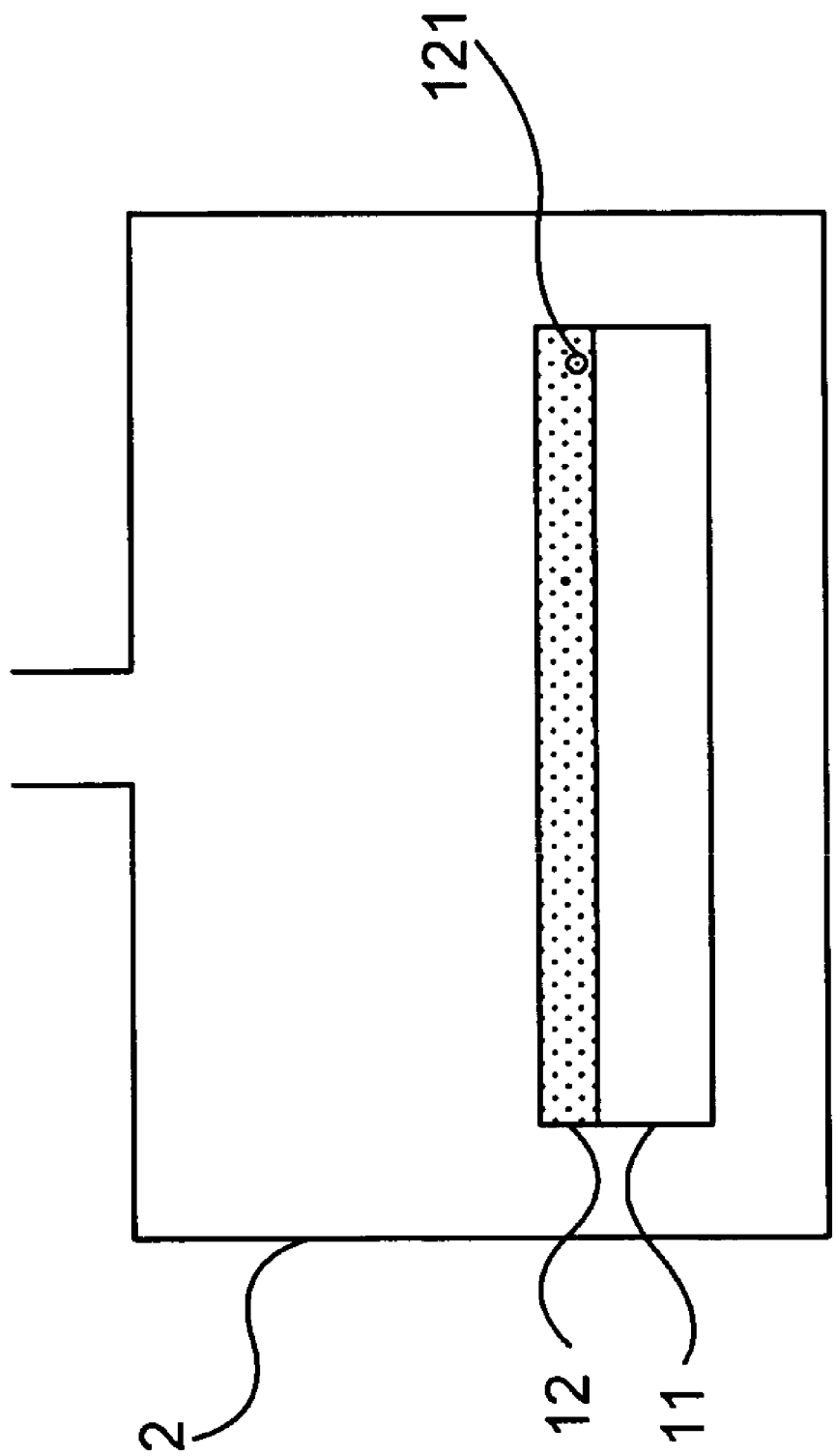
FIG. 3C is a view showing the SRO film layer being formed on the surface of the first substrate.

Please refer to FIG. 3A, FIG. 3B and FIG. 3C, which are views showing the first substrate being heated to a deposition temperature, the sub-stoichiometric Si oxide film being deposited on a surface of the first substrate, and the SRO film layer being formed on the surface of the first substrate. As shown in the figures, a first substrate 11 is placed into a reaction chamber 2 to be heated 3 to a 500 Celsius degrees (° C.) of temperature for deposition. By using helium or argon as a gas for dilution and transition, a mixed gas 4 of reaction sources having a volume ratio or a flow ratio between 10:1 and 1:10 is sent into the reaction chamber 2, where the reaction sources can be a dichlorosilane ($SiH_2Cl_2$) and a nitrous oxide ($N_2O$), or a silane ($SiH_4$) and a $N_2O$. After the mixed gas 4 is sent into the reaction chamber 2, a reaction happens in the reaction chamber 2 while a temperature for deposition is kept at 500° C. After the reaction, whose formula is $SiH_4 \square xN_2O \rightarrow SiO_x \square xN_2 \square 2H_2$, a sub-stoichiometric Si oxide film 122 is formed on the first substrate 11 with a ratio (x) smaller than 2 of oxygen atomicity to Si atomicity. Then, the excessive Si atoms is processed with a phase separation, a crystal nucleation and a crystal growth with a deposition time of 1 minute (m in) to 300 min to transform the sub-stoichiometric Si oxide film 122 into an SRO film layer 12 cove red on the first substrate 11, as shown in FIG. 3C. In this way, the present invention uses a procedure of Plasma-Enhanced Chemical Vapor Deposition (PECVD) to deposit the sub-stoichiometric Si oxide film 122 on the surface of a first substrate 11 to obtain the SRO film layer 12, where the SRO film layer 12 is evenly distributed with a plurality of Si nano-grains 121 for a white light luminance center and the granular size of the Si nano-grain 121 is an essential factor for obtaining a white light spectrum. Finally, the first substrate 11 together with the SRO film layer 12 covered on the first substrate 11 is adhered to an UV photodiode with an adhesive. Hence a novel SRO white light photodiode according to the present invention is obtained.

To sum up, the present invention is an SRO white light photodiode, where an SRO film layer is formed through a PECVD procedure without hydrogen and is adhered to an UV photodiode with an adhesive to form the SRO white light photodiode. The present invention is easy fabricated with low cost by using Si as raw material while being prevented from problems of using and discharging a chemical poisonous heavy-metal.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A silicon-rich-oxide (SRO) white light photodiode, comprising:
   (a) a first substrate;
   (b) an SRO film layer having a sub-stoichiometric silicon (Si) oxide film deposited on a surface of said first substrate by using a Plasma-Enhanced Chemical Vapor Deposition (PEVCD) procedure, said Si oxide film having a ratio smaller than 2 of oxygen atomicity to Si atomicity, said Si oxide film distributed with a plurality of Si nano-grains; and
   c) a photodiode having a second substrate producing an ultraviolet light, said SRO film layer adhered to said photodiode,
   wherein the ultraviolet light emitted by the photo diode exciting said plurality of Si nano-grains of said SRO film layer and said SRO film layer producing a white light having a continuous light spectrum having a wave length between 400 nm and 700 nm,
   wherein said SRO film layer is located between said first substrate and said second substrate, said SRO film layer directly contacting said first substrate along an entire length of said SRO film layer.

2. The white light photodiode according to claim 1, wherein said first substrate is made of a material selected from a group consisting of quartz, an aluminum oxide ($Al_2O_3$) and a glass.

3. The white light photodiode according to claim 1, wherein said second substrate is made of a material selected from a group consisting of a quartz, a $Al_2O_3$ and a glass.

4. The white light photodiode according to claim 1, wherein said SRO film layer has a thickness between 1 nanometer (nm) and 10000 nm.

5. The white light photodiode according to claim 1, wherein said Si nano-grain has a granular size between 0.1 nm and 10 nm.

6. The white light photodiode according to claim 1, wherein said SRO film layer is obtained with a reaction source of a dichlorosilane ($SiH_2Cl_2$) and a nitrous oxide ($N_2O$).

7. The white light photodiode according to claim 6, wherein a volume ratio of said $SiH_2Cl_2$ to said $N_2O$ is between 10:1 and 1:10.

8. The white light photodiode according to claim 6, wherein a flow ratio of said $SiH_2Cl_2$ to said $N_2O$ is between 10:1 and 1:10.

9. The white light photodiode according to claim 1, wherein said SRO film layer is obtained with a reaction source of a silane ($SiH_4$) and a $N_2O$.

10. The white light photodiode according to claim 9, wherein a volume ratio of said $SiH_4$ to said $N_2O$ is between 10:1 and 1:10.

11. The white light photodiode according to claim 9, wherein a flow ratio of said $SIH_4$ to said $N_2O$ is between 10:1 and 1:10.

12. The white light photodiode according to claim 1, wherein said SRO film layer is deposition temperature between 450 Celsius degrees (° C.) and 550° C.

13. The white light photodiode according to claim 1, wherein said Si oxide film has a deposition time between 1 minute (min) and 300 min.

14. The white light photodiode according to claim 1, wherein said PECVD procedure utilizing a gas being an inert gas selected from a group consisting of helium and argon.

* * * * *